United States Patent [19]
Fiedler

[11] 4,055,775
[45] Oct. 25, 1977

[54] TRANSMISSION CIRCUIT FOR DIRECT CURRENT DATA TRANSMISSION

[75] Inventor: Helmut Fiedler, Gartenberg, Germany

[73] Assignee: Siemens Aktiengesellschaft, Munich, Germany

[21] Appl. No.: 577,448

[22] Filed: May 14, 1975

Related U.S. Application Data

[63] Continuation of Ser. No. 464,860, April 29, 1974, which is a continuation of Ser. No. 257,382, May 26, 1973, which is a continuation of Ser. No. 23,000, March 26, 1970, abandoned.

[30] Foreign Application Priority Data

Apr. 9, 1969 Germany ............................... 1918090

[51] Int. Cl.$^2$ .................... H03K 17/60; H04L 25/02
[52] U.S. Cl. .................... 307/254; 178/69 R; 307/242; 307/291; 328/164
[58] Field of Search ........ 307/289, 291, 292, 241–244, 307/247, 254, 268; 328/206, 213, 164; 330/32; 178/69 R; 178/16 EA

[56] References Cited

U.S. PATENT DOCUMENTS

| | | | |
|---|---|---|---|
| 2,840,728 | 6/1958 | Haugk et al. | 307/291 |
| 2,975,305 | 3/1961 | Pinet | 307/255 |
| 3,155,833 | 11/1964 | DeFrigs | 307/291 |
| 3,320,551 | 5/1967 | Miller | 307/310 |
| 3,336,536 | 8/1967 | Dame | 307/310 |

*Primary Examiner*—Stanley D. Miller, Jr.
*Attorney, Agent, or Firm*—Gerald L. Lett

[57] ABSTRACT

A transmission circuit including cross coupled transistors is described. The circuit is symmetrical and the base of each transistor is coupled to the collector of the other and also to a supply voltage through a voltage divider. The output is taken across the emitters of the transistors. Switching circuits which are coupled to the voltage dividers change the resistance of the circuit and effect an output signal. The symmetrical configuration of the circuit and the cross coupling make the circuit insensitive to temperature changes.

6 Claims, 2 Drawing Figures

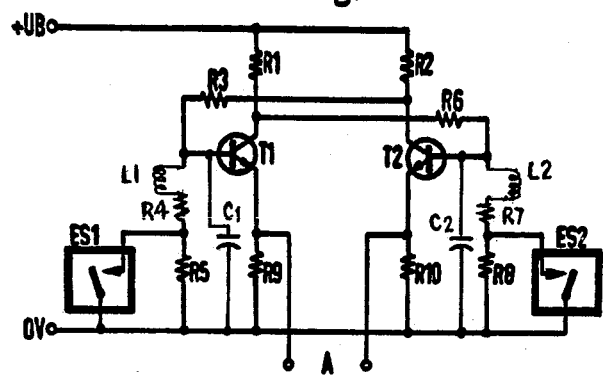
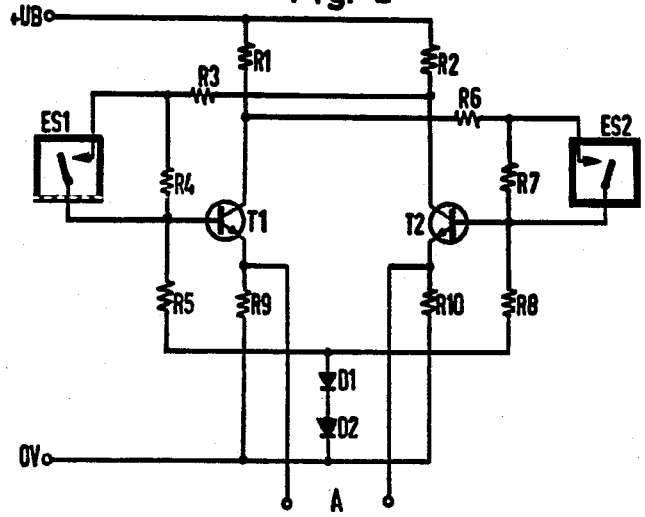

TRANSMISSION CIRCUIT FOR DIRECT CURRENT DATA TRANSMISSION

This is a continuation of application Ser. No. 464,860, filed Apr. 29, 1974, which is a continuation of application Ser. No. 257,382, filed May 26, 1973, which is a continuation of application Ser. No. 23,000 filed Mar. 26, 1970 now abandoned.

CROSS REFERENCE TO RELATED APPLICATIONS

Applicant claims priority from German Applicaton P 19 18 090.6 filed Apr. 9, 1969.

BACKGROUND OF THE INVENTION

An object of the invention is the provision of a transmission circuit with a low transmission level and extremely low internal resistance for direct current data transmission over directly connected lines.

It is known in the art of teleprinting to transmit the individual telegraphy signals over the line in the form of direct current pulses with a high level. Such signals, however, are subject to a large amount of crosstalk and distortion. These accordingly occur because of the capacitive and inductive coupling which exists between the individual conductors of a cable, and the cross talk distrubance in the conductors adjacent to the telegraphy line.

A known circuit arrangement, which is to be found in U.S. Pat. No. 3,413,413, shows a transmission system for the transmission of direct current telegraphy signals in the form of voltage level steps. This known method reduces the crosstalk and distortion of the transmitted telegraphy steps in transmissions over symetrically and electrically switched lines. This transmission system makes it possible to transmit the telegraphy signal at the desired speed of transmission with a very low transmitting voltage. The known transmission system uses a so called electronic telegraph relay at the transmitter for the formation of the transmitting voltage. Of necessity, the electronic relay must have a small source impendance. As a result of this small source impedance, only small voltage disturbances and slight distortions of the telegraphy steps or signals occur. The purpose of this telegraph relay is to receive the telegrapy signals from the data input apparatus, such as a teletypewriter, to regenerate that signal, i.e., correct distortions, and to then pass the signal on with the same polarities, but with the described small transmitting voltage. The reconstituted telegraph signal is coupled to an output circuit and from there to a transmission line. The known electronic telegraph relays are electrically isolated, and for this reason, they really function so that an oscillator is formed which gives off an alternating voltage. Each telegraph step can then assume one of two conditions, i.e., character current condition or separation current condition. One of the two conditions of the telegraph step actuates the oscillator so that it oscillates and generates an alternating voltage, while the other condition blocks the oscillator so that no alternating voltage can occur. The alternating voltage is inductively decoupled and rectified. The rectified voltages are applied to two parallel connected diodes, which, however, are connected for current flow in directions of opposite polarity. A resistance is connected in series with the diodes. Using a voltage divider, the voltage at the diodes is set to the value of the transmission voltage, which, for example, may be plus or minus 0.4 volts. The attainable internal resistances thereby are about 10 Ohm. The temperature dependence of this circuit is very high because of the temperature coefficient of the diodes, so that the influence of the temperature must be reduced with temperature-dependent resistors in the voltage divider. However the setting of these low valued resistors is very difficult. The known telegraph relays have large current requirements since in the limit a large current flows over the resistances and the diodes. An alternating voltage oscillator is used to supply this current requirement; the oscillator operates at a sufficiently high frequency that distortions of the telegraph signal are as small as possible. The oscillator emits a relatively high valued current so that it is difficult to suppress interference from it or to prevent it from forming disturbances which occur in the frequency ranges of wireless transmission sources or the like.

SUMMARY OF THE INVENTION

It is an object of this invention to provide a transmitting circuit for the direct current data transmission with low transmission level, which possesses an especially low inner resistance and is very stable.

The foregoing and other objects are attained in a circut configuration in which a transistor circuit, for example, an emitter follower, is supplied for each condition which the telegraph signal might take, i.e., each voltage level. Each emitter follower is associated with a voltage divider which applies a portion of the operating voltage to the base electrode of the emitter follower transistor. A switching device is connected in parallel with a resistance in each voltage divider for short circuiting that resistance upon the occurrence of an appropriate condition of the telegraph relay thereby varying the voltage output of the voltage divider. The low level transmission voltage comes into being as the difference between the voltages appearing at the two emitters.

Accordingly, the transmission circuit is a compensated circuit, so that a high stability is obtained. The transmission voltage is taken from the available, mostly above ground current supply of the receiver which is needed for the reception of the data transmission signals in the opposite direction. The transmission circuit is stable against voltage fluctuations and is completely in-sensitive to temperature fluctuations. The circuit possesses a very low internal resistance which can be set on the value of zero Ohm. The circuit possesses a great disturbance reliability and is suited for data transmission at the highest speeds. The output requirements of the transmission circuit and the component requirements are very low. The circuit can generate neutral current- or polar current-signals; it can also be used as converter from neutral current into polar current or from polar current into neutral current. The transmission circuit is also suited for application in a ground-bound working voltage. The transmission circuit can also be applied in direct current telegraphy with a high level.

Details of the invention are explained with the help of two advantageous working examples which are shown in the drawings.

BRIEF DESCRIPTION OF THE DRAWINGS

FIG. 1 shows a transmission circuit with low transmission level according to the invention.

FIG. 2 shows a transmission circuit with low transmission level and especially high voltage stability according to the invention.

DETAILED DESCRIPTION OF THE INVENTION

The transmission circuit in FIG. 1 includes two transistors T1 and T2 which are both operated in emitter-follower configuration. The emitter of transistor T1 is connected through resistor R9 with the one polarity (O V) and the collector through resistor R1 with the other polarity (+UB) of the working voltage. The emitter of transistor T2 is connected through resistor R10 with the one polarity (O V) and the collector through resistor R2 with the other polarity (+UB) of the working voltage. The input voltages of the two emitter-base connections taken from the working voltage by one voltage divider each. Thus the base of transistor T1 is connected to the junction of resistors R3 and R4 in the voltage divider which consists of resistors R2, R3, R4 and R5 and the base of transistor T2 is connected to junction of resistors R6 and R7 in the voltage divider which consists of resistors R1, R6, R7 and R8. In both transistors collector current is flowing, i.e. in an amount such that the voltage drop at resistors R9 and R10 equals the input voltage. The transmitting voltage having a low valued direct current voltage is taken from between the two emitter electrodes of transistors T1 and T2 and coupled to a transmission line through terminals A. Each emitter follower has an emitter resistance R9 and R10 across which a direct current voltage appears. The difference between these two voltage values forms the transmission voltage. When the two emitter followers and voltage dividers are constructed in the same manner, and in the absence of telegraph signal so that electronic switching devices ES1 and ES2 are open, the same voltage appears across each emitter resistance. Since the difference beteen the two voltages applied to output A is zero, no transmitting voltage occurs. When a telegraph step or series of steps is to be transmitted, according to their respective conditions, the appropriate electronic switching device is activated. The parallel resistance across which the electronic switching device is connected is thereby short circuited. Through this change of the voltage divider the control voltage at the base electrode of the transistor coupled to that voltage divider is modified so that a different voltage results at the emitter resistance of that transistor. This difference changes the voltage value across the emitter terminals from zero to a finite value. The value by which the input voltage to the circuit was changed is transmitted in its full magnitude to the terminals A and is coupled to the transmission line. Since an electronic switching device ES1 or ES2 is associated with each condition that a telegraph step can assume, at any given time, only one of the two electronic switching devices depending on the transmitted text will be activated. Thereby, positive and negative differences, and thus, negative and positive direct current voltage values are coupled to the terminals A and to the transmission line. The changing of the voltage divider ratio takes place alternately through one of the two electronic switching systems ES1 and ES2, which are shown in simplified manner as mechanical contacts. Each of these switching systems can be replaced by a transistor, which is alternately controlled by the direct current conditions to be transmitted, either into the conducting or into the blocked condition. Electronic switching signal repeaters can also be arranged as switching systems, or other electronic switching elements which emit two conditions. Switching systems ES1 and ES2 determine the maximum admissible speed at which the transmission circuit can emit data. Through introduction of fast optical switching elements for the switching systems the transmission circuit can operate at the highest data transmission speeds. As soon as a switching system ES1, or ES2, is actuated, the contact closes, so that the resistor R5, or R8, connected in parallel to the affected switch, is short-circuited. The voltage divider ratio then changes and the change of the input voltage is coupled directly to output terminals. When the emitter follower and the voltage divider are constructed in the same manner, the electronic switching devices ES1 and ES2 are alternately activated in the transmission of different telegraph steps so that positive and negative voltage values of equal magnitude appear at the terminals A. In telegraph transmission technology an output signal of this type is designated as a symetrical double current signal. The output signal at the terminals A is formed from the difference between the voltages which appear across emitter resistances R9 and R10.

The voltage appearing at outlet terminals A consists of the difference of the voltage drops at the two resistors R9 and R10. If the switching contacts of the two switching systems ES1 and ES2 are in rest condition, i.e. in open condition, the transmission voltage has a value of O.V. If the contact of the switching system ES1 is closed, the base potential of transistor T1 is lowered and the voltage drop at resistor R9 is also decreased. However, the transistor T1 remains conductive. This change is reflected by the transmission voltage at terminals A. The current at terminals A flows if the consumer is connected at one emitter-follower into the outlet electrode, while it flows out of the outlet electrode in the case of the other emitter-follower. Because of cross-coupling of the base-collector electrodes of transistors T1 and T2 resistors R9 and R10, and the connection of the output terminals A to resistors R9 and R10, the base potential of one transistor increases while in the case of the other transistor the base potential and the outlet voltage decrease. Through the two resistors R1 and R2, which are connected into the collector circuit of the other transistor, the changes in the potential at the base electrodes are cancelled because of the changing collector current. Therefore, the internal resistance of the transmission circuit consists of the sum of the internal resistances of the emitter-follower circuits. Through suitable dimensioning of the resistors R1 and R2 the internal resistance can be made approximately zero ohm. This value of the internal resistance can be selected and set this low, as basically a negative inner resistance can also be obtained with the circuit. The influence of temperature fluctuations is almost completely avoided through the principle of the compensation circuit. Only a different temperature behavior of the base-emitter diodes of the two transistors can occur. However, by utilizing two transistors which have the same temperature behavior at the base-emitter junctions, this influence can be avoided.

As shown in the FIG. 1 embodiment, the inventive circuit can be made to prevent the creation of high frequency components and thereby undesirable disturbances in adjacent lines. To this end, capacitors C1 and C2, respectively, are connected between the base electrodes of the transistors T1 and T2 and the reference potential, which may be zero volts. The transmission voltage will follow a curve which is similar to the curve of the charge exchange of the capacitance after a purely real internal resistance is obtained. High frequency components can be further reduced by the insertion of inductive elements L1 and L2, respectively, in series with resistors R4 and R7, as shown in FIG. 1. This further measure causes the voltage reversal of the transmission voltage to follow an especially desirable path and one which is free of harmonic oscillations. While the inductive and capacitive elements are shown as a part of the FIG. 1 embodiment, they are not a necessary part thereof in order to obtain the desirable results of this invention. They are only of demonstrating a means by which possibly undesirable affects can be avoided in the preferred embodiment illustrated herein.

FIG. 2 is similar to the transmission circuit shown in FIG. 1 with a slight change to improve the voltage stability. In FIG. 2 the components carry the same designations as in FIG. 1. The two base electrode voltage dividers are connected over diodes D1 and D2 with the one polarity (O V) of the working voltage. Through these additional diodes the base potential of the two transistors is composed of a working voltage-dependent portion which originates at the resistors, and a constant portion which originates at the resistor, and a constant portion which originates at the diodes. Fluctuations in working voltage now only act in the ratio of the working voltage-dependent portion to the constant portion of the base potential.

In the application as converter circuit, for example from neutral current into polar current the switching circuit which is not used, e.g. ES1 or ES2 is replaced by a short circuit, that is a closed contact.

Additional measures to improve the transmission circuit can be adapted so that no high frequency components originate and thereby undesirable disturbances in the adjacent lines are avoided. The capacitor is inserted between the base electrode and the referenced potential (0 volts). The transmission voltage there follows a curve which is similar to the charge exchange of the capacitance of the capacitor after a purely real internal resistance is obtained. Further lowering of the high frequency components can be obtained by the addition of inductive elements connected in series with resistors R4 and R7. These are added in addition to the capacitors. This measure causes the voltage reversal of the transmission voltage to take an especially favorable course, which is free of harmonic vibrations.

The transmission circuit also can be operated in a grounded current supply mode of operation. Therefore the transmission circuit is also suited for data transmission with a higher level.

What is claimed is:

1. Apparatus for producing at different times positive and negative direct current signals responsive to binary signal levels from a data source, said current singals having substantially equal magnitudes and being produced from two output signal terminals, said apparatus having a substantially zero source impedance, comprising:
   a source of operating voltage having a pair of output terminals,
   first and second transistors, each having a conductive path established between the collector and emitter thereof and a base electrode, the application of voltages to which causes proportional amounts of current to flow through said conductive path, first and second equal-valued emitter resistances connecting the emitters of said first and second transistors, respectively, to one of said output terminals of said operating voltage source,
   first and second equal-valued collector resistances connecting the collectors of said first and second transistors, respectively, to the other of said output terminals of said operating voltage source,
   first voltage divider means having input terminals connected, respectively, to the collector of said second transistor and to said one output terminal of said operating voltage source and having output terminals connected, respectively, to the base of said first transistor and to said one output terminal of said operating voltage source,
   first switching means coupled to said voltage divider means for varying, responsive to the presence of a first of said binary signal levels, the voltage output at said output terminals of said first voltage divider means,
   second voltage divider means having input teriminals connected, respectively, to the collector of said first transistor and to said one output terminal of said operating voltage source and having output terminals connected, respectively, to the base of said second transistor and to said one output terminal of said operating voltage source,
   second switching means coupled to said second voltage divider means for varying, responsive to the presence of a second of said binary signal levels, the voltage output at said output terminals of said second voltage divider means,
   said operting voltage source output, said first and second emitter resistances and the base currents of said first and second transistors being of values such that when said first and second switching means are unoperated, currents of substantially equal values flow through said conductive paths of said first and second transistors and
   connection means connecting said emitters of said first and second transistors, respectively, to said output signal terminals of said apparatus as to produce therefrom direct current signals which are a function of the difference between the magnitudes of the currents flowing, respectively, through said first and second transistors.

2. The apparatus defined in claim 1 wherein said first and second voltage dividers are constructed from three resistors, said resistors being connected in series, and said first voltage divider having a first of said resistors connecting the collector of said second transistor to the base of said first transistor and second and third resistors connecting the base of said first transistor to said one output terminal of said operating voltage source, said second voltage divider having a first resistor connecting the collector of said first transistor to the base of said second transistor and second and third resistors connecting the base of said second transistor to said one output terminal of said operating voltage source.

3. The apparatus defined in claim 2 further comprising a series connected pair of diodes interposed in series between a common connection of said third resistors of said first and second voltage dividers and said one output terminal of said operating voltage source.

4. The apparatus defined in claim 2 wherein said first and second switching means comprise short circuiting switches connected across said third resistors of said first and second voltage dividers, respectively, said first and second switching means being made operable by the appearance of said first and second levels of said binary data signals, respectively.

5. The apparatus defined in claim 1 further comprising a pair of capacitors connected, respectively, between the base electrodes of said first and second transistors and said one terminal of said operating voltage source.

6. The apparatus defined in claim 1 further comprising a pair of inductors connecting, respectively, the outputs of said first and second voltage dividers to the bases of said first and second transistors.

* * * * *